(12) United States Patent
Chen et al.

(10) Patent No.: US 11,056,172 B1
(45) Date of Patent: Jul. 6, 2021

(54) FLASH MEMORY AND OPERATION METHOD THEREOF FOR CONTROLLING RAISING SPEED OF THE READ PASS VOLTAGE

(71) Applicant: MACRONIX International Co., Ltd., Hsinchu (TW)

(72) Inventors: Che-Ping Chen, Taipei (TW); Ya-Jui Lee, Taichung (TW); Shin-Jang Shen, HsinChu County (TW); Yih-Shan Yang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/860,349

(22) Filed: Apr. 28, 2020

(51) Int. Cl.
| | |
|---|---|
| *G11C 7/22* | (2006.01) |
| *G11C 11/4076* | (2006.01) |
| *G11C 11/4074* | (2006.01) |
| *G11C 11/4099* | (2006.01) |
| *G11C 11/4094* | (2006.01) |
| *G11C 11/408* | (2006.01) |
| *G11C 16/04* | (2006.01) |
| *G11C 16/32* | (2006.01) |
| *G11C 16/34* | (2006.01) |
| *G11C 16/26* | (2006.01) |
| *G11C 16/06* | (2006.01) |

(52) U.S. Cl.
CPC ............ *G11C 11/4076* (2013.01); *G11C 7/22* (2013.01); *G11C 11/4074* (2013.01); *G11C 11/4085* (2013.01); *G11C 11/4094* (2013.01); *G11C 11/4099* (2013.01); *G11C 16/0483* (2013.01); *G11C 16/06* (2013.01); *G11C 16/26* (2013.01); *G11C 16/32* (2013.01); *G11C 16/3418* (2013.01); *G11C 16/3427* (2013.01)

(58) Field of Classification Search
CPC ..... G11C 16/0483; G11C 16/08; G11C 16/26; G11C 16/32; G11C 16/3418; G11C 16/3427
See application file for complete search history.

(56) References Cited

U.S. PATENT DOCUMENTS 9,466,369 B1 * 10/2016 Pang .................. G11C 16/3427
10,629,272 B1  4/2020 Lu et al.
(Continued)

OTHER PUBLICATIONS

"Office Action of Taiwan Counterpart Application", dated Jan. 26, 2021, pp. 1-6.

*Primary Examiner* — Mushfique Siddique
(74) *Attorney, Agent, or Firm* — J.C. Patents

(57) ABSTRACT

A flash memory and an operation method thereof are provided. The flash memory includes a plurality of memory cell strings and a pass voltage generator. Each of the memory cell strings includes a plurality of memory cells. The pass voltage generator is configured to provide a pass voltage to a plurality of word lines of a plurality of unselected memory cells of a selected memory string. During a reading operation, the pass voltage generator raises the pass voltage from a first voltage at a first time point, and raises the pass voltage to a second voltage at a second time point. The second voltage is lower than a target voltage times a preset ratio The first time point is earlier than a start time point of a bit line voltage received by the selected memory cell, and the second time point occurs at the start time point of the bit line voltage.

16 Claims, 8 Drawing Sheets

(56) References Cited

U.S. PATENT DOCUMENTS

| | | | |
|---|---|---|---|
| 2008/0056008 A1* | 3/2008 | Aritome | G11C 16/3427 365/185.24 |
| 2009/0080263 A1* | 3/2009 | Lee | G11C 11/5628 365/185.19 |
| 2009/0296490 A1* | 12/2009 | Kwak | G11C 16/30 365/185.23 |
| 2012/0281477 A1* | 11/2012 | Sakaniwa | G11C 16/0483 365/185.18 |
| 2013/0100747 A1* | 4/2013 | Leem | G11C 7/00 365/189.011 |
| 2016/0163394 A1* | 6/2016 | Yoo | G11C 16/24 365/185.11 |

* cited by examiner

FLASH MEMORY AND OPERATION METHOD THEREOF FOR CONTROLLING RAISING SPEED OF THE READ PASS VOLTAGE

BACKGROUND OF THE INVENTION

1. Field of the Invention

The invention relates to a flash memory and an operation method thereof, and particularly to a NAND flash memory and a flash memory operation method thereof.

2. Description of Related Art

In current electronic devices, a flash memory is widely used as a storage device for data. With the development of an integrated circuit processing technology, density of memory is greatly increased to increase storage capacity of the data. In order to reduce a product price, number of reads increases with an increase of bit density and number of memory cells.

In any case, when a memory page of the flash memory is read for a huge number of times, read disturbance may occur. A plurality of reads may fail when a digital value of a particular bit changes from 1 to 0. Such read disturbance is an important reason for affecting reliability of the flash memory.

SUMMARY OF THE INVENTION

The invention is directed to a flash memory and a flash memory operation method thereof, which effectively reduce the probability of read disturbance.

The flash memory of the invention includes a plurality of memory cell strings and a pass voltage generator. Each of the memory cell strings includes a plurality of memory cells. The pass voltage generator is configured to provide a pass voltage to a plurality of word lines of a plurality of unselected memory cells of a selected memory string. During a reading operation, the pass voltage generator raises the pass voltage from a first voltage at a first time point, and raises the pass voltage to a second voltage at a second time point. The second voltage is lower than a target voltage times a preset ratio. The first time point is earlier than a start time point of a bit line voltage received by the selected memory cell, and the second time point occurs at the start time point of the bit line voltage.

The flash memory operation method of the invention includes: providing a pass voltage to a plurality of word lines of a plurality of unselected memory cells of a selected memory string; and during a reading operation, raising the pass voltage from a first voltage at a first time point to a second voltage at a second time point, wherein the second voltage is lower than a target voltage times a preset ratio, the first time point is earlier than a start time point of a bit line voltage received by the selected memory cell, and the second time point occurs at the start time point of the bit line voltage.

Based on the above, in the invention, when a memory cell is read, before a start time point of a bit line voltage, the pass voltage is gradually raised to a second voltage lower than a target voltage times a preset ratio, which may effectively reduce perturbation of a bit line caused by voltage rising of the pass voltage and reduce a chance of read disturbance.

DESCRIPTION OF THE EMBODIMENTS

Figure 1:
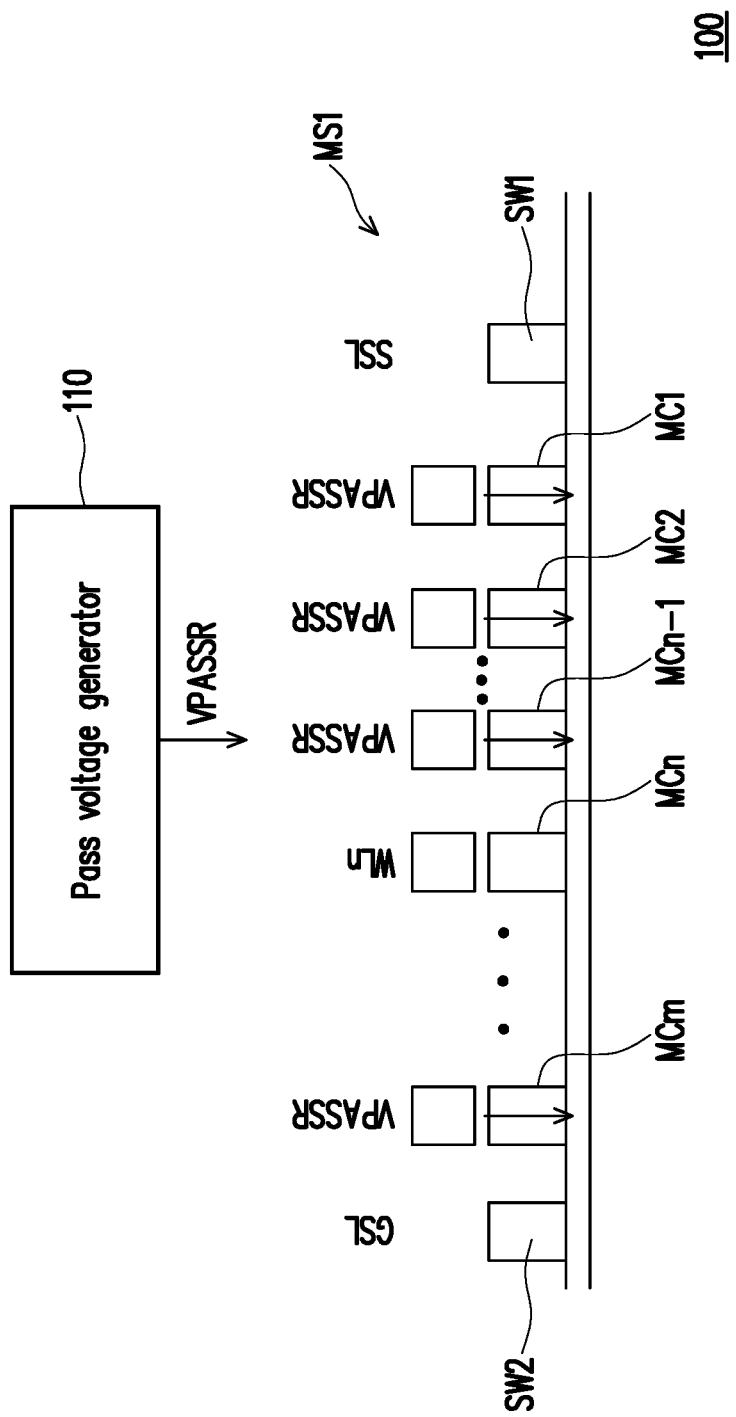
FIG. 1 is a schematic diagram of a flash memory according to an embodiment of the invention.

Referring to FIG. 1, FIG. 1 is a schematic diagram of a flash memory according to an embodiment of the invention. The flash memory 100 includes a pass voltage generator 110 and a plurality of memory cell strings MS1 as shown in FIG. 1. For simplicity, there is only one memory cell string MS1 shown in FIG. 1. The pass voltage generator 110 is configured to generate a pass voltage VPASSR. During a reading operation, the pass voltage generator 110 provides the pass voltage VPASSR to a plurality of word lines of a plurality of unselected memory cells (memory cells $MC_1$-$MC_{n-1}$ and $MC_m$) of a selected memory string (e.g., a memory cell string MS1). The word line of the selected memory cell $MC_n$ receives a word line voltage $WL_n$ corresponding to the reading operation. In addition, the memory cell string MS1 includes switches SW1 and SW2 to be coupled to selection signals SSL and GSL respectively.

Figure 2:
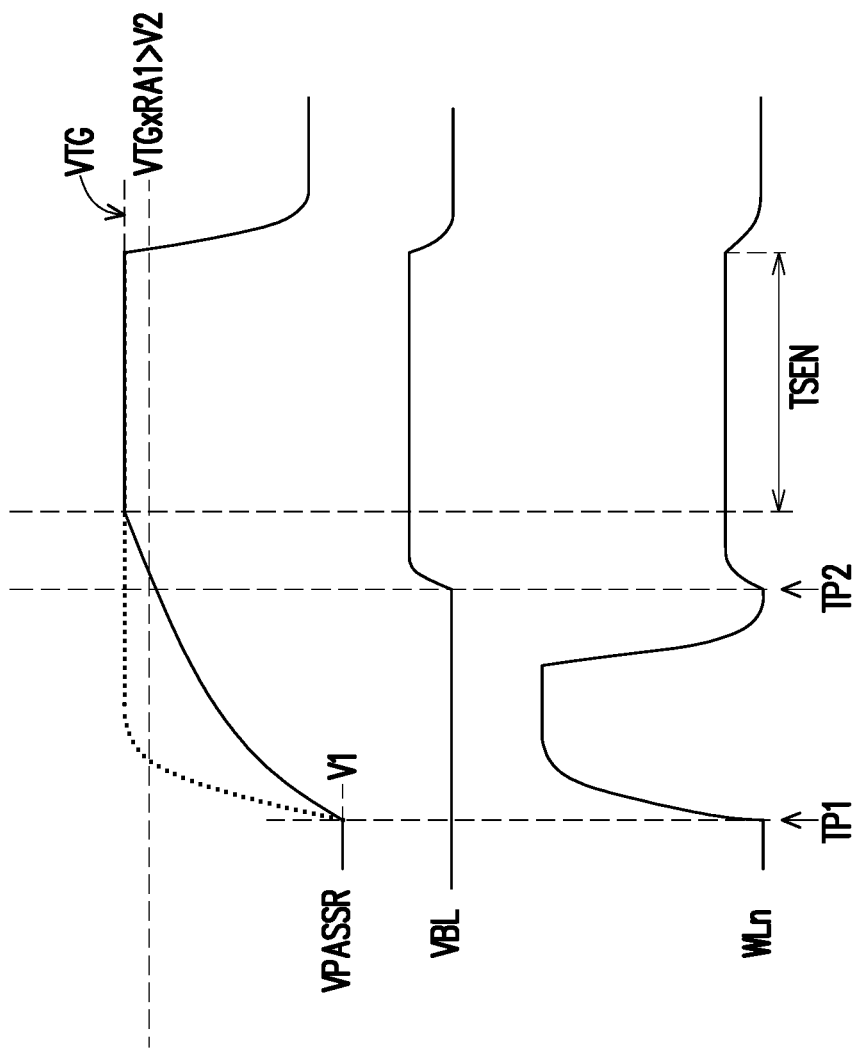
FIG. 2 is a voltage waveform diagram of a flash memory according to an embodiment of the invention.

Referring to FIG. 1 and FIG. 2 synchronously, FIG. 2 is a voltage waveform diagram of a flash memory according to an embodiment of the invention. During the reading operation, the pass voltage VPASSR generated by the pass voltage generator 110 is raised from a first voltage V1 at a first time point TP1, and the pass voltage VPASS is raised to a second voltage V2 at a second time point TP2. The second voltage V2 is lower than a target voltage VTG times a preset ratio RA1.

In the present embodiment, the first time point TP1 is the same as a start time point of the word line voltage $WL_n$ received by the selected memory cell $MC_n$. The second time point TP2 is the same as a start time point of a bit line voltage VBL received by a bit line corresponding to the selected memory cell string MS1. That is, the word line voltage $WL_n$ begins to be raised at the first time point TP1, and the bit line voltage VBL begins to be raised at the second time point TP2 after the first time point TP1.

Additionally, the operation of raising the word line voltage $WL_n$ which is started at the first time point TP1 is configured to make the word line of the selected memory cell $MC_n$ perform a pre-charging operation. After the second time point TP2 when the bit line voltage VBL is started, data of the selected memory cell $MC_n$ may be sensed during a sensing time interval TSEN. In the sensing time interval TSEN, the pass voltage generator 110 may raise the pass voltage VPASSR to the target voltage VTG.

The preset ratio RA1 may be determined by a designer according to an actual design condition of the flash memory. In the embodiment of the invention, the preset ratio RA1 may be 90%.

The flash memory 100 in the embodiment of the invention may be a NAND flash memory. In terms of hardware architecture, the flash memory 100 may be a two-dimensional or three-dimensional flash memory. In addition, the flash memory 100 may provide a single-level cell (SLC), a multiple-level cell (MLC), a triple-level cell (TLC), a quad-level cell (QLC) or a combination of the above.

Figure 3:
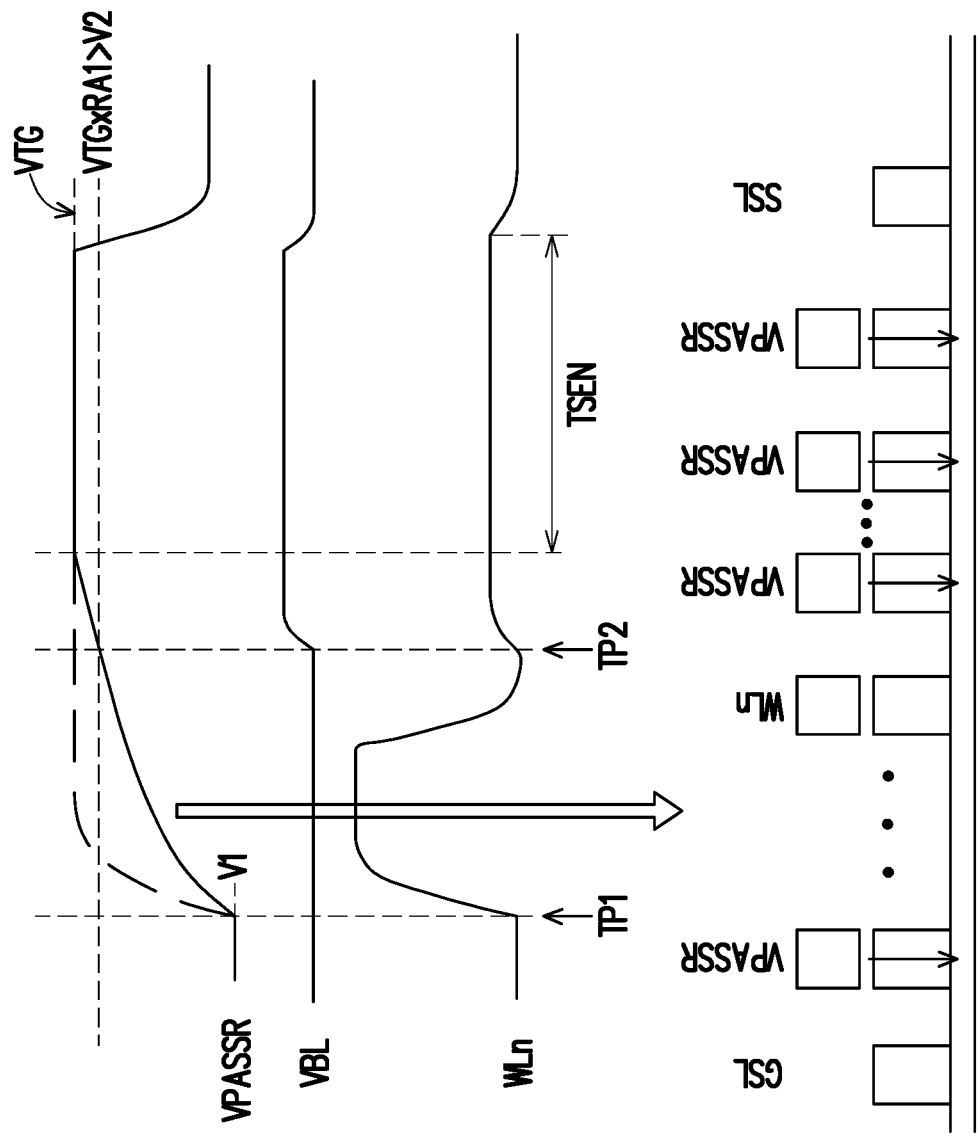
FIG. 3 is a comparison diagram of a selected memory cell string and a voltage waveform according to an embodiment of the invention.

FIG. 3 illustrates a comparison diagram of a selected memory cell string of voltage waveforms (VPASSR) according to an embodiment of the invention and a conventional practice. In the conventional practice, a raising speed of the pass voltage VPASSR (shown as dashed line in VPASSR) is quick, and the pass voltage VPASSR reaches the target voltage VTG before the sensing time interval TSEN. In FIG. 3, the pass voltage generator according to the embodiment of the invention reduces a raising speed of the pass voltage VPASSR (shown as solid line in VPASSR) and does not raise the pass voltage VPASSR to the target voltage VTG before the sensing time interval TSEN, which may effectively reduce influences of the pass voltage VPASSR on a memory cell string channel and reduce jitter of the bit line voltage VBL caused by the rise of the pass voltage VPASSR, reducing the chance of read disturbance.

Figure 4:
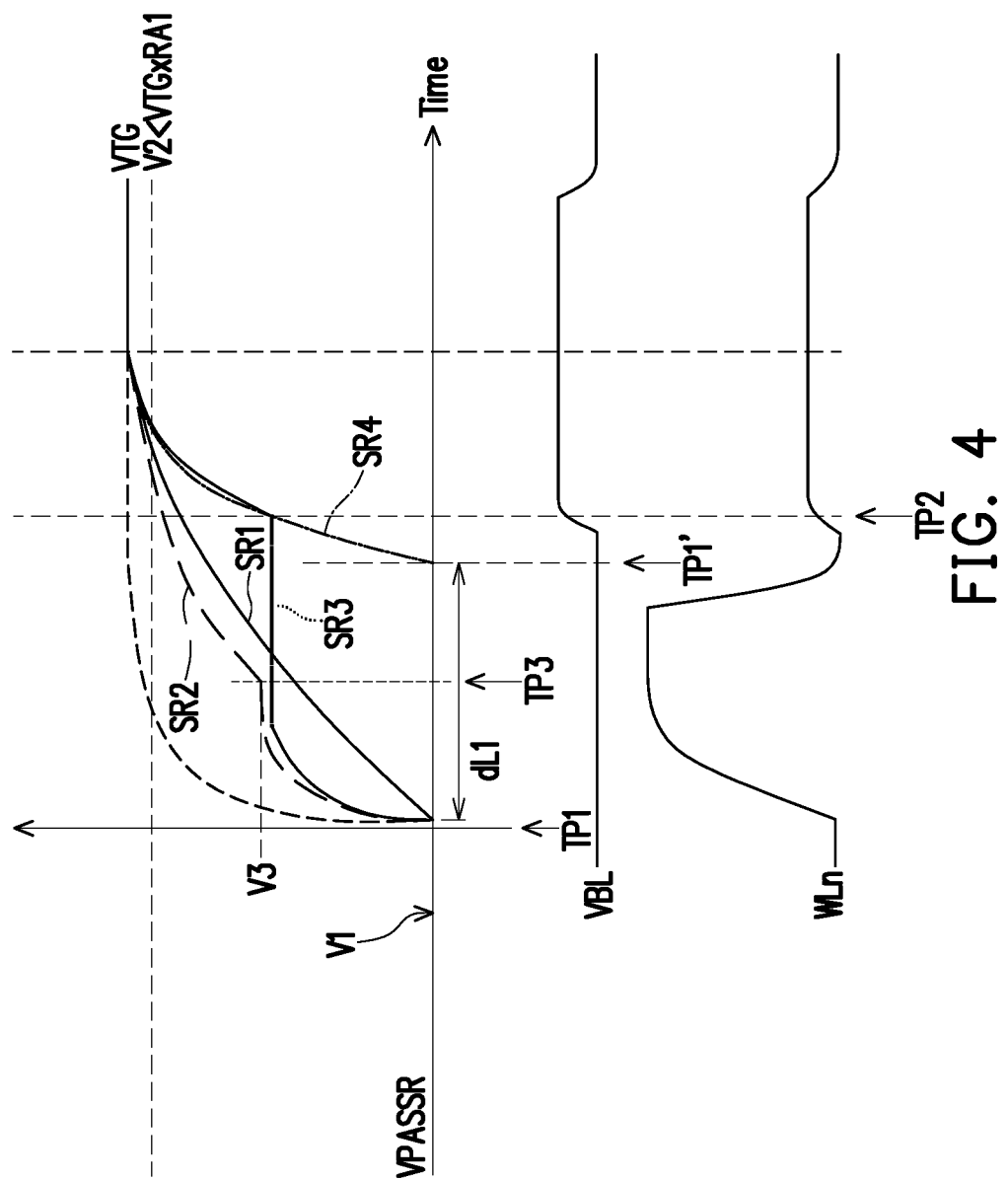
FIG. 4 is a waveform diagram of a pass voltage according to other embodiments of the invention.

Referring to FIG. 4, FIG. 4 is a waveform diagram of a pass voltage according to other embodiments of the invention. In an embodiment of the invention, during a reading operation, the pass voltage VPASSR may be raised in a variety of manners. Raising curves SR1-SR4 in FIG. 4 correspond to four implementations of the embodiment of the invention respectively.

In the first implementation, corresponding to the rising curve SR1 of the pass voltage VPASSR, the pass voltage generator selects a start time point of a word line voltage $WL_n$ as a first time point TP1, and begins to raise the pass voltage VPASSR from a first voltage V1 at the first time point TP1. At a second time point TP2 (start time point of the bit line voltage VBL), the pass voltage generator makes the pass voltage VPASSR (a second voltage) lower than a product of a target voltage VTG and a preset ratio RA1.

In addition, in the second implementation, the rising curve SR2 (shown as a dashed line in VPASSR) of the pass voltage VPASSR may be divided into two segments. The pass voltage generator selects a start time point of a word line voltage $WL_n$ as a first time point TP1, begins to raise the pass voltage VPASSR from a first voltage V1 at the first time point TP1, and raises the pass voltage VPASSR to a third voltage V3 at a third time point TP3. Next, the pass voltage generator begins to raise the pass voltage VPASSR from the third voltage V3 at the third time point TP3, and raises the pass voltage VPASSR to a second voltage V2 at a second time point TP2. The third voltage V3 is higher than the first voltage V1, and the third voltage V3 is lower than the second voltage V2. The third time point TP3 is later than the first time point TP1, and the third time point TP3 is earlier than the second time point TP2.

It is worth noting that the pass voltage generator may raise the pass voltage VPASSR through a first driving capability from the first time point TP1 to the third time point TP3, and may raise the pass voltage VPASSR through a second driving capability from the third time point TP3 to the second time point TP2. The first driving capability is different from the second driving capability.

In addition, in the third implementation, the pass voltage generator also sets the start time point of the word line voltage $WL_n$ as a first time point TP1, and begins to raise the pass voltage VPASSR at the first time point TP1. According to the rising curve SR3, the pass voltage generator may keep the operation of the pass voltage VPASSR constant after raising the pass voltage VPASSR for a period of time. A voltage value at the second time point TP2 is less than the voltage value of the pass voltage VPASSR corresponding to the above plurality of rising curves SR1 and SR2 at the second time point TP2, and is necessarily less than a product of a target voltage VTG and a preset ratio RA1.

In addition, in the fourth implementation, the pass voltage generator does not set the start time point of the word line voltage $WL_n$ as a start time point to raise the pass voltage VPASSR. A first time point TP1' is set after the start time point of the word line voltage $WL_n$, wherein a time point before the start time point (the second time point TP2) of the bit line voltage VBL as the first time point TP1'. Correspondingly to this, the rising curve SR4 begins to be raised from a first voltage V1 at the first time point TP1', and is raised to a voltage value less than a product of a target voltage VTG and a preset ratio RA1 at the second time point TP2. A delay time dL1 exists between the first time point TP1' and the start time point of the word line voltage $WL_n$.

Additionally, the delay time may be set between 0-71 microseconds. Besides, the reading operation of the memory cell string after the start time point (time point TP2) of the bit line voltage VBL to enter a sensing time interval is 0-36 microseconds. Definitely, the time range may be adjusted according to a process and an operating voltage used by a memory device or various other variables. The above description is only an example and is not used to limit the scope of the invention.

It can be known from the above description that in the embodiment of the invention, the pass voltage VPASSR may also be raised in different manners. A waveform in the raising process of the pass voltage VPASSR is not specifically limited, and the key point is that the pass voltage VPASSR needs to be raised to a voltage value less than a product of a target voltage VTG and a preset ratio RA1 at the start time point (time point TP2) of the bit line voltage VBL, and disturbance caused by the raising process to the bit line voltage VBL is reduced accordingly.

Figure 5A:
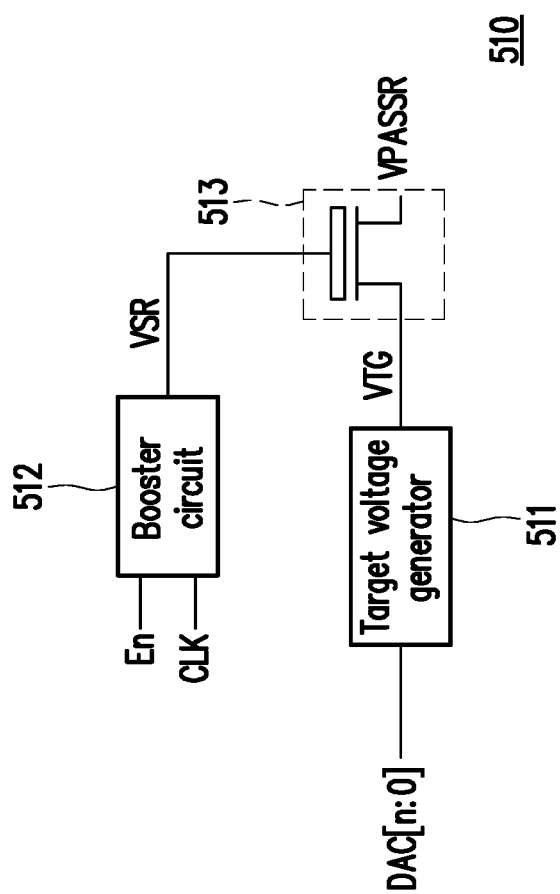
FIG. 5A and FIG. 5B are schematic diagrams of different implementations of a pass voltage generator according to an embodiment of the invention respectively.
Figure 5B:
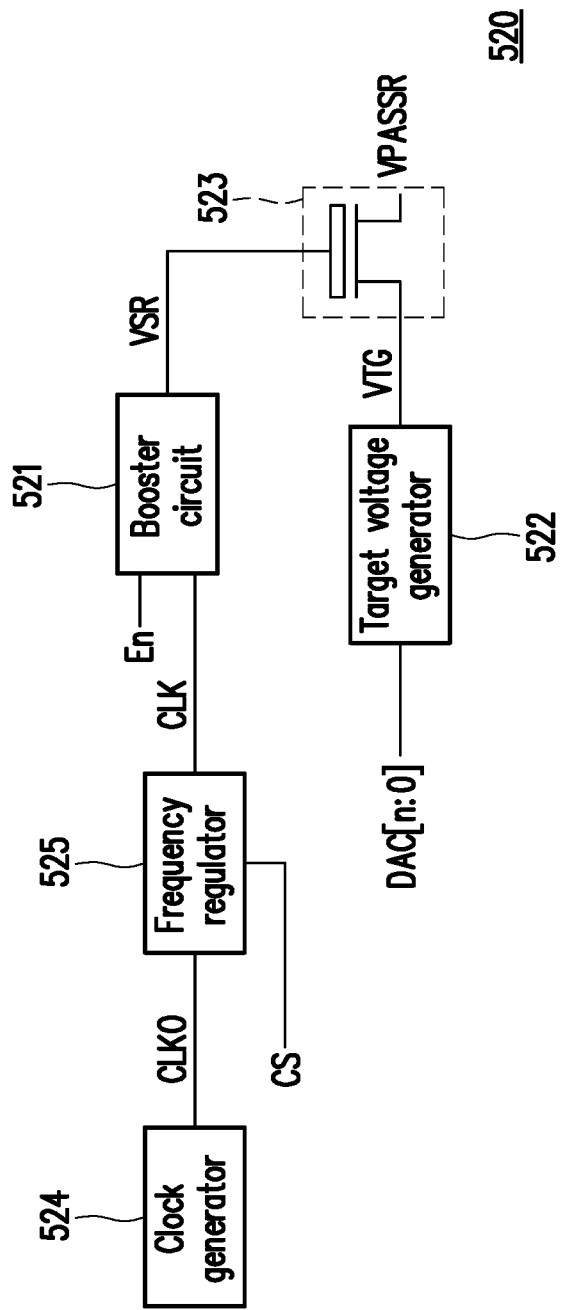

Referring to FIG. 5A and FIG. 5B below, FIG. 5A and FIG. 5B are schematic diagrams of different implementations of a pass voltage generator according to an embodiment of the invention respectively. In FIG. 5A, the pass voltage generator 510 includes a target voltage generator 511, a booster circuit 512, and a switch 513. The target voltage generator 511 is configured to generate a target voltage VTG. In the present embodiment, the target voltage generator 511 may determine a voltage value of the target voltage VTG according to a target voltage code DAC[N:0], wherein the number of bits of the target voltage code may be 1(N=0) or more (N>0), and the target voltage generator 511 may be a digital-to-analog converter.

The booster circuit 512 receives a clock signal CLK and an enable signal En. The booster circuit 512 may be started according to the enable signal En, and generate a control voltage by pumping up a reference voltage based on the clock signal CLK. In the present embodiment, the booster circuit 512 may be a charge pump circuit.

The switch 513 may be a transistor switch. One end of the switch 513 receives a target voltage VTG, a control end of the switch 513 receives a control voltage VSR, and the other end of the switch 513 provides a pass voltage VPASSR. It should be noted herein that the switch 513 may act as a clamper. The pass voltage VPASSSR equals to the control voltage VSR—a threshold voltage VT of the switch 513 when the control voltage VSR < the target voltage VTG+ the threshold voltage VT of the switch 513. After the control voltage VSR>=the target voltage VTG+ the threshold voltage VT of the switch 513, the pass voltage VPASSSR equals to the target voltage VTG.

It can be known from the above description that when the flash memory performs a reading operation, the booster circuit 512 may increase the voltage value of the control voltage VSR over time and thus control the equivalent resistance provided by the switch 513 to enable the pass voltage VPASSR to gradually increase in a time order.

In FIG. 5B, the pass voltage generator 520 includes a target voltage generator 521, a booster circuit 522, a switch 523, a frequency regulator 525, and a clock generator 524. The target voltage generator 511 is configured to generate a target voltage VTG. Different from the embodiment of FIG. 5A, a frequency of a clock signal CLK received by the booster circuit 522 may be adjusted. The clock generator 524 is configured to generate a reference clock signal CLK0, and the frequency regulator 525 may adjust a frequency of the reference clock signal CLK0 according to a conditioning signal to generate the clock signal CLK.

In the present embodiment, the frequency regulator 525 may dynamically change the frequency of the clock signal CLK. For example, the frequency regulator 525 may generate the clock signal CLK by performing a frequency division operation for the reference clock signal CLK0, wherein the frequency regulator 525 may generate a divisor of a frequency division signal according to a conditioning signal CS. Herein, the conditioning signal CS may be changed dynamically.

By dynamically adjusting the frequency of the clock signal CLK, the increasing process of the control voltage VSR may be carried out with linear or nonlinear changes, and the pass voltage VPASSR may be raised in one or more segments.

On the other hand, the target voltage code DAC[N:0] received by the target voltage generator 522 may also be dynamically adjusted in a time order in the process of the pass voltage VPASSR, thereby adjusting the rising speed of the pass voltage VPASSR.

Figure 6:
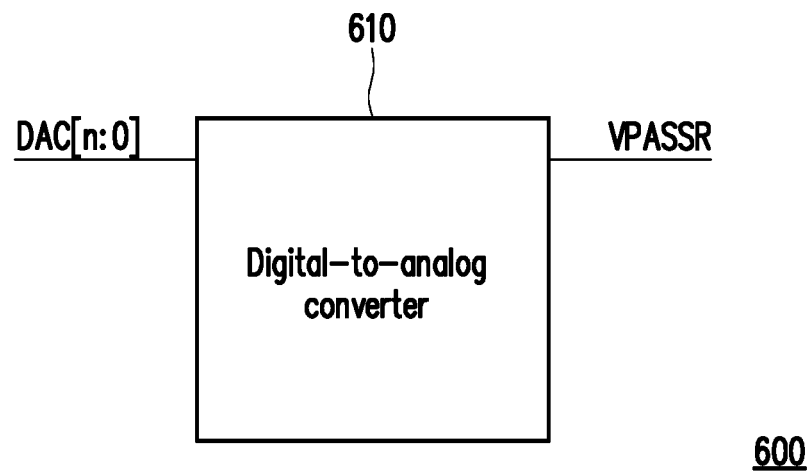
FIG. 6 is a schematic diagram of another implementation of a pass voltage generator according to an embodiment of the invention.

Referring to FIG. 6 below, FIG. 6 is a schematic diagram of another implementation of a pass voltage generator according to an embodiment of the invention. In FIG. 6, the pass voltage generator 600 includes a digital-to-analog converter 610. The digital-to-analog converter 610 receives a voltage control code DAC[N:0], and converts the voltage control code DAC[N:0] to generate an output voltage as a pass voltage VPASSR. It should be noted herein that the voltage control code DAC[N:0] may produce a plurality of changes in a time order. Specifically, corresponding to the embodiment of FIG. 2 of the invention, a plurality of sub time points may be segmented between the first time point TP1 and the second time point TP2. The voltage control code DAC[N:0] may increase in sequence corresponding to the plurality of time points. In this way, the digital-to-analog converter 610 may adjust up the voltage value of the pass voltage VPASSR corresponding to the increasing voltage control code DAC[N:0].

In the embodiment of the invention, the voltage control code DAC[N:0] may increase linearly or nonlinearly. Each increment in the voltage control code DAC[N:0] may be fixed or unfixed, which is not specifically limited. In addition, the number of the sub time points may also be set by the designer, which is not fixedly limited.

Figure 7:
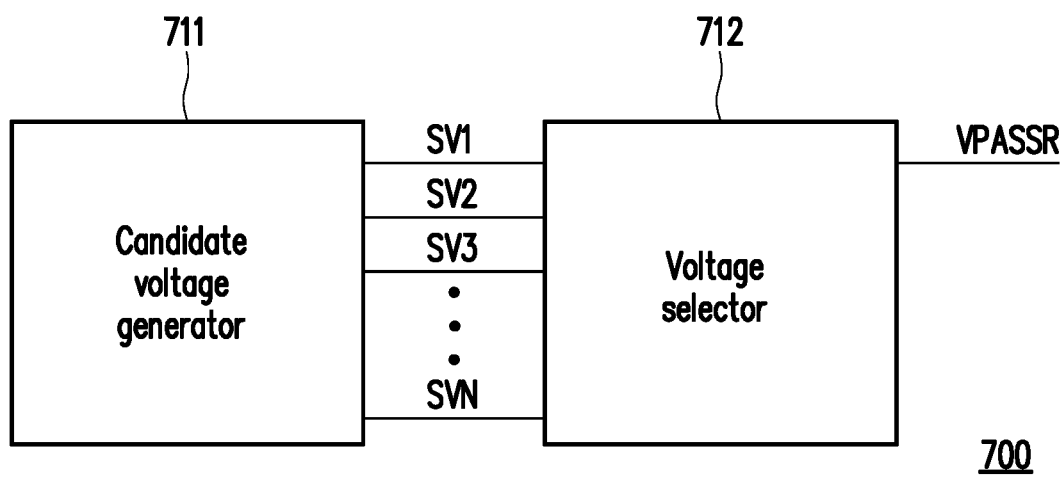
FIG. 7 is a schematic diagram of another implementation of a pass voltage generator according to an embodiment of the invention.

Referring to FIG. 7 below, FIG. 7 is a schematic diagram of another implementation of a pass voltage generator according to an embodiment of the invention. The pass voltage generator 700 includes a candidate voltage generator 711 and a voltage selector 712. The candidate voltage generator 711 may generate a plurality of candidate voltages SV1-SVN with different voltage values. Moreover, corresponding to the embodiment of FIG. 2 of the invention, a plurality of sub time points may be segmented between the first time point TP1 and the second time point TP2. Corresponding to the plurality of sub time points, the voltage selector 712 selects the plurality of candidate voltages SV1-SVN for output and generates a pass voltage VPASSR. By taking candidate voltage SV1<candidate voltage SV2< . . . <candidate voltage SVN as an example, the voltage selector 712 may select the candidate voltage SV1, the candidate voltage SV2, . . . , and the candidate voltage SVN sequentially in a time order for outputting, and thus generates the pass voltage VPASSR raised in a time order.

In the present embodiment, the candidate voltage generator 711 may generate the candidate voltages SV1-SVN by performing multi-stage voltage division for a reference voltage (through a voltage division circuit well-known to a person of ordinary skill in the art). The voltage selector 712 may be implemented by applying a voltage selection circuits well-known to a person of ordinary skill in the art, which is not specifically limited.

Figure 8:
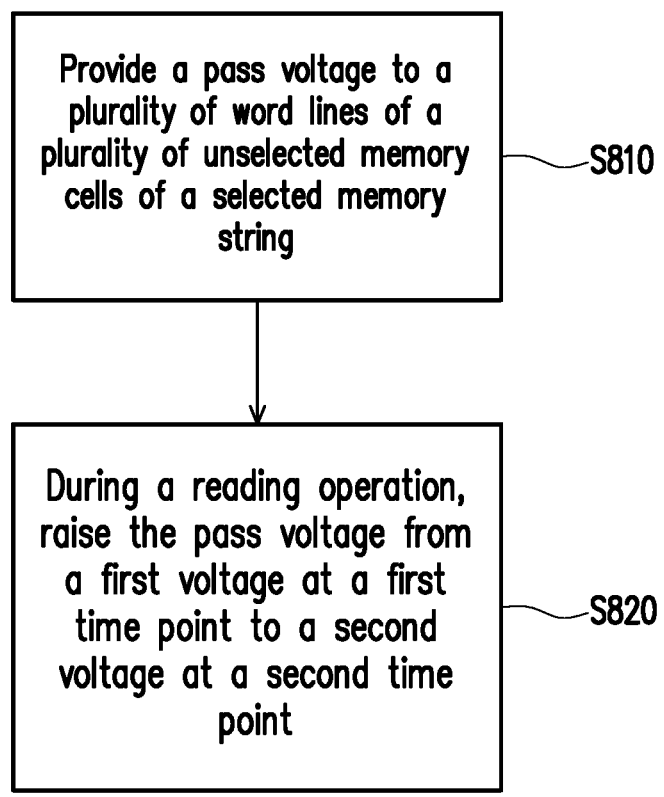
FIG. 8 is a flowchart of a flash memory operation method according to an embodiment of the invention.

Referring to FIG. 8, FIG. 8 is a flowchart of a pass voltage controlling method according to an embodiment of the invention. In step S810, a pass voltage is provided to a plurality of word lines of a plurality of unselected memory cells of a selected memory string. In step S820, during a reading operation, the pass voltage is raised from a first voltage at a first time point to a second voltage at a second time point. The second voltage is lower than a target voltage times a preset ratio, the first time point is earlier than a start time point of a bit line voltage received by the selected memory cell, and the second time point occurs at the start time point of the bit line voltage.

Implementation details of the above steps are described in detail in the above embodiments and implementations, and are not described below.

Based on the above, in the invention, during a reading operation of a flash memory, a rising rate of a passing voltage is adjusted before a sensing time interval to reduce possible disturbance caused by the passing voltage to a bit line voltage. In this way, read disturbance during the reading operation can be reduced and the chance of read errors can be reduced.

What is claimed is:

1. A flash memory, comprising:
   a plurality of memory cell strings, where each of the memory cell strings comprises a plurality of memory cells; and
   a pass voltage generator coupled to the memory cell strings, configured to provide a pass voltage to a plurality of word lines of a plurality of unselected memory cells of a selected memory string,
   wherein during a reading operation, the pass voltage generator raises the pass voltage from a first voltage at a first time point, and raises the pass voltage to a second voltage at a second time point,
   wherein the second voltage is lower than a target voltage times a preset ratio, the first time point is earlier than a start time point of a bit line voltage received by the selected memory cell, and the second time point occurs at the start time point of the bit line voltage,
wherein the pass voltage generator raises the pass voltage to the target voltage in a sensing time interval after the second time point and wherein the preset ratio is 90%.

2. The flash memory according to claim 1, wherein the first time point occurs at a start time point of a word line voltage received by a selected memory cell, or the first time point is later than the start time point of the word line voltage and earlier than the start time point of the bit line voltage.

3. The flash memory according to claim 1, wherein during the reading operation, the pass voltage generator raises the pass voltage to a third voltage at a third time point between the first time point and the second time point,
wherein the third voltage is higher than the first voltage, and lower than the second voltage, the pass voltage generator provides a first driving capability between the first time point and the third time point and provides a second driving capability between the third time point and the second time point, and the first driving capability is different from the second driving capability.

4. The flash memory according to claim 1, wherein the pass voltage generator comprises:
a booster circuit that receives a clock signal and generates a control voltage by pumping up a reference voltage based on the clock signal;
a target voltage generator, configured to generate the target voltage; and
a switch, comprising a first end to receive the target voltage, the switch being controlled by the control voltage to provide the pass voltage at a second end.

5. The flash memory according to claim 4, wherein the pass voltage generator further comprises:
a clock generator that generates a reference clock signal; and
a frequency regulator that generates the time clock signal by adjusting a frequency of the reference clock signal according to a conditioning signal.

6. The flash memory according to claim 4, wherein the target voltage generator is a digital-to-analog converter which receives a target voltage code of a digit and converts the target voltage code to generate the target voltage.

7. The flash memory according to claim 1, wherein the pass voltage generator provides a plurality of increasing output voltages in sequence between a plurality of sub time points between the first time point and the second time point to generate the pass voltage.

8. The flash memory according to claim 7, wherein the pass voltage generator comprises:
a candidate voltage generator that generates a plurality of output voltages; and
a voltage selector that selects, corresponding to each of the sub time points, each of the output voltages in sequence as the pass voltage.

9. The flash memory according to claim 7, wherein the pass voltage generator comprises:
a digital-to-analog converter that receives a plurality of voltage control codes in sequence corresponding to the sub time points, the digital-to-analog converter converting the voltage control codes in sequence to generate the output voltages.

10. The flash memory according to claim 9, wherein the pass voltage generator further comprises:
a control code generator coupled to the digital-to-analog converter, configured to generate control codes of the output voltages.

11. A flash memory operation method, comprising:
providing a pass voltage to a plurality of word lines of a plurality of unselected memory cells of a selected memory string; and
during a reading operation, raising the pass voltage from a first voltage at a first time point to a second voltage at a second time point,
wherein the second voltage is lower than a target voltage times a preset ratio, the first time point is earlier than a start time point of a bit line voltage received by the selected memory cell, and the second time point occurs at the start time point of the bit line voltage wherein the preset ratio is 90%; and
raising the pass voltage to the target voltage in a sensing time interval after the second time point.

12. The flash memory operation method according to claim 11, further comprising:
enabling the first time point to occur at a start time point of a word line voltage received by a selected memory cell, or enabling the first time point to be later than the start time point of the word line voltage and earlier than the start time point of the bit line voltage.

13. The flash memory operation method according to claim 11, further comprising:
raising the pass voltage with a first driving capability to a third voltage at a third time point between the first time point and the second time point; and
raising the pass voltage with a second driving capability to a second voltage between the third time point and the second time point.

14. The flash memory operation method according to claim 11, wherein the step of raising the pass voltage from the first voltage at the first time point to the second voltage at the second time point comprises:
pumping up a reference voltage according to a clock signal to generate a control voltage; and
enabling a switch according to the control voltage to generate the pass voltage.

15. The flash memory operation method according to claim 14, further comprising:
generating the clock signal by adjusting a frequency of a reference clock signal according to a conditioning signal.

16. The flash memory operation method according to claim 11, wherein the step of raising the pass voltage from the first voltage at the first time point to the second voltage at the second time point comprises:
respectively providing a plurality of increasing output voltages in sequence at a plurality of sub time points between the first time point and the second time point to generate the pass voltage.

* * * * *